United States Patent [19]
Pfeiffer et al.

[11] Patent Number: 6,092,981
[45] Date of Patent: Jul. 25, 2000

[54] MODULAR SUBSTRATE CASSETTE

[75] Inventors: Ken Pfeiffer, Round Rock; Greg Verdict, Austin, both of Tex.

[73] Assignee: Applied Materials, Inc., Santa Clara, Calif.

[21] Appl. No.: 09/267,711

[22] Filed: Mar. 11, 1999

[51] Int. Cl.⁷ ............................ A47G 19/08; B65D 85/86
[52] U.S. Cl. ........................ 414/810; 206/710; 206/711; 211/41.18; 414/811; 414/937; 414/938
[58] Field of Search ...................... 414/810, 937, 414/938; 211/41.18; 206/710, 711; 118/728

[56] References Cited

U.S. PATENT DOCUMENTS

| | | | |
|---|---|---|---|
| 3,090,593 | 5/1963 | Pro | 251/87 |
| 4,514,129 | 4/1985 | Legille et al. | 414/200 |
| 4,632,624 | 12/1986 | Mirkovich et al. | 414/217 |
| 4,727,993 | 3/1988 | Mirkovich et al. | 211/41 |
| 4,872,554 | 10/1989 | Quernemoen | 206/454 |
| 4,873,942 | 10/1989 | Engle | 118/728 |
| 4,962,726 | 10/1990 | Matsushita et al. | 118/719 |
| 5,019,233 | 5/1991 | Blake et al. | 204/792.12 |
| 5,121,705 | 6/1992 | Sugino | 118/719 |
| 5,387,067 | 2/1995 | Grunes | 414/217 |
| 5,435,682 | 7/1995 | Crabb et al. | 414/217 |
| 5,472,099 | 12/1995 | Terashima | 211/41.18 |
| 5,474,410 | 12/1995 | Ozawa et al. | 414/217 |
| 5,534,074 | 7/1996 | Koons | 118/728 |
| 5,556,248 | 9/1996 | Grunes | 414/416 |
| 5,609,689 | 3/1997 | Kato et al. | 118/719 |
| 5,697,749 | 12/1997 | Iwabuchi et al. | 414/217 |
| 5,711,647 | 1/1998 | Slocum | 414/749 |
| 5,730,575 | 3/1998 | Nichols et al. | 414/404 |
| 5,743,699 | 4/1998 | Ishihara | 414/217 |
| 5,788,304 | 8/1998 | Korn et al. | 294/159 |

Primary Examiner—Steven A. Bratlie
Attorney, Agent, or Firm—Thomason, Moser & Patterson

[57] ABSTRACT

The present invention generally provides a modular substrate cassette used to store substrates. The modular substrate cassette is designed to use different components that may be collectively assembled into different cassette configurations while substantially reducing or eliminating custom and complex fabrication costs. The modular substrate cassette may accommodate multiple substrate sizes, including 100 mm, 200 mm, and 300 mm substrates, as well as a variety of substrate shapes, including circular, square, and rectangular. In a preferred embodiment, the substrate supports use materials from standard geometries of bar stock and/or plate stock to minimize the costs of production. Also, in a preferred embodiment, the substrate cassette is designed to allow multi-directional access to substrates stored in the cassette.

32 Claims, 11 Drawing Sheets

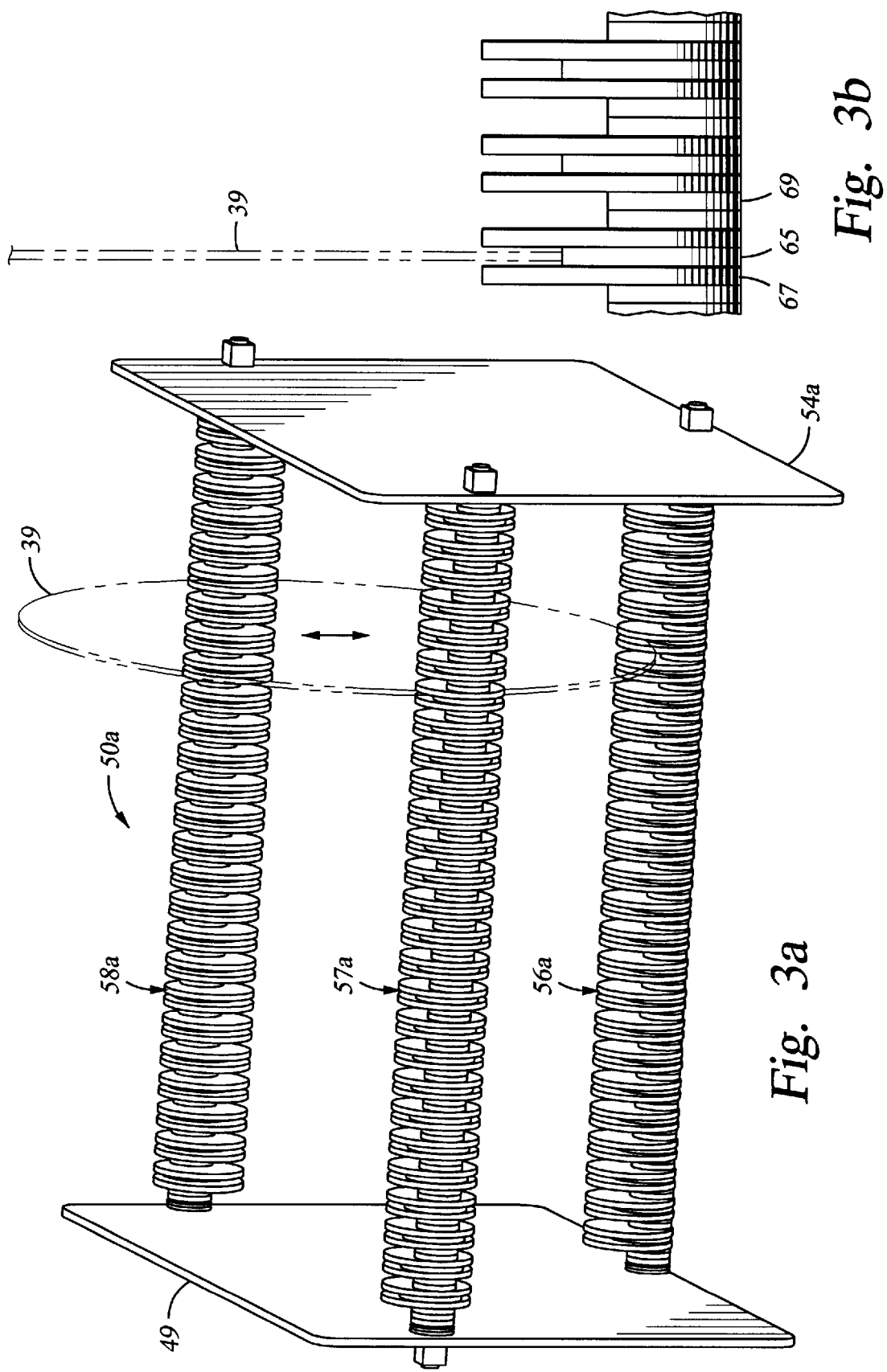

MODULAR SUBSTRATE CASSETTE

BACKGROUND OF THE INVENTION

1. Field of the Invention

The present invention relates to an apparatus for supporting substrates in a substrate processing system. More specifically, the invention relates to a modular substrate cassette for storing substrates in a substrate processing system.

2. Background of the Related Art

In the fabrication of electronic devices such as integrated circuits, multiple conducting, semiconducting and dielectric materials are deposited on and removed from substrates to form the electronic devices. Cluster tools which combine numerous substrate processing units in a processing platform are generally used in advanced microelectronics fabrication. A cluster tool generally refers to a modular, multichamber, integrated processing system, which typically includes a central substrate handling vacuum chamber and a number of peripheral vacuum processing chambers. A batch of substrates are typically loaded into the cluster tool and undergo a series of one or more process steps. The process steps are usually performed under vacuum conditions in the various process stations without being exposed to ambient conditions. The transfer of the substrates through the processing system is managed by the central substrate handling vacuum chamber, typically referred to as a transfer chamber. Different configurations of cluster tools, such as linear or radial, are available and offer high yields of devices due to lower defect densities.

Cluster tools typically include at least two load lock chambers mounted on the transfer chamber for loading or unloading substrates while maintaining the vacuum conditions in the transfer chamber and the process chambers. Unprocessed substrates are loaded into the system through one load lock chamber while processed substrates are unloaded from the system through the other load lock chamber.

FIG. 1 is a top schematic view of a commercially available substrate processing system, known as an Endura® platform, available from Applied Materials, Inc. located in Santa Clara, Calif. The platform combines vacuum processing chambers designed to process substrates at low pressure/high vacuum in the range of about $10^{-3}$ to $10^{-8}$ torr. A loading robot 8 using a blade 7 loads and unloads substrates into and from a cassette 10 disposed in each of the load lock chambers 12 and 14. Substrate cassettes are used for transportation, storage, inspection, and other purposes in processing substrates. The face 44 of the cassette 10 is typically aligned in the load lock chamber with the load lock access 17 of the first load lock chamber 12 or the second load lock chamber 14, so that the loading robot 8 with the blade 7 accesses the substrates in the direction of arrow 13. Typically, after loading the substrates, the cassette 10 is rotated and the face 45 of the cassette is aligned with the first slit valve 9 or the second slit valve 11.

A first transfer robot 16 having a blade 18 is located in a buffer chamber 20. The substrates are introduced into and withdrawn from the platform through a first slit valve 9 communicating with first load lock chamber 12 or through a second slit valve 11 communicating with a second load lock chamber 14 in the direction of arrow 15. The first transfer robot moves the substrate 22 between various pre/post processing chambers 24 and 26 surrounding the buffer chamber 20. The buffer chamber 20 and the transfer chamber 32 are connected through two common chambers 28. A second transfer robot 30 is located in a transfer chamber 32 to transfer a substrate 34 between the chambers 28 and 36 surrounding the transfer chamber 32. Chambers 28 may also include a substrate cassette disposed therein to store one or more substrates either on entry or on exit from the transfer chamber and the back end of the platform system where the processing chambers are typically located. A substrate may be processed or cooled/heated in one or more chambers during processing to accomplish fabrication of a desired semiconductor structure on the substrate. A microprocessor controller 38 and associated software are provided to control processing and movement of substrates through the system.

One configuration of a platform aligns the multiple load lock chambers 12 and 14 with the load lock access 17 to allow a single path access between the robot 8 and the cassette 10. However, single path access to robot 16 typically requires the load lock chambers to also be aligned with load lock access 19, typically at an angle to the load lock access 17. In the platform of FIG. 1, the angle is about 20°. As a result of the platform configuration, multi-directional access must be accommodated or a rotating mechanism must be used to rotate the cassettes into the desired alignment. The inclusion of a rotating mechanism increases the complexity of the apparatus and can negatively affect throughput of the system. Therefore, it is desirable to allow the substrate to be retrieved at multiple angles through the cassette independent of cassette rotation. Multi-directional access simplifies the robotic structures, linkages, and programming and allows more flexibility in chamber design.

FIG. 2 is a perspective view of a typical cassette 10 and a substrate 39, shown in phantom lines, disposed therein with the top bracket removed to more clearly view the cassette components. Generally, a substrate 39 is received in a cassette slot 41 formed between two substrate supports 40 and supported in a pair of alignment apertures 42 disposed on opposing substrate supports. The substrate supports 40 are typically either machined into sidewalls of the cassette or are disposed into channels formed into sidewalls of the cassette. In some instances, the substrate supports 40 are manufactured from metal or plastic. Some manufacturers produce injection molded plastic cassettes, some of which allow access from one face only, such as face 44. The metal substrate supports are machined and sometimes coated for wear or corrosion protection. The costs can be several thousand dollars for a substrate cassette due to the difficulty in machining. A preferred material used for the substrate support 40 is quartz or ceramic material because of high temperature dimensional stability, chemical purity, durability, and resistance to corrosive environments under processing conditions. The type of material, however, can create difficulties in the manufacturing process, such as time consuming grinding of the supports 40 to provide the alignment apertures 42 for the substrates. Such manufacturing can encompass hundreds of dollars for each support, totaling many thousands of dollars to about ten thousand dollars for the cassette assembly.

In the semiconductor industry, different semiconductor manufacturers have varying needs in processing. Typically, 25 substrates are supported in a cassette, used to process a "batch". Other manufacturers require 27 substrates in the cassette with two substrates being "dummy" substrates for pre-processing and post-processing procedures. Other manufacturers may order other variations in the quantity of substrates to be supported by the substrate cassette. Some cassettes are used for other purposes such as loading and unloading a batch of cassettes of up to about 100 substrates or more into and from a furnace for other processing, such as annealing. It would be advantageous to readily adapt a standard set of components for a variety of substrate cassette configurations, particularly those providing multi-directional access. Some attempts in providing multi-directional access have been disclosed in U.S. Pat. No. 5,387,067 and U.S. Pat. No. 5,556,248, a continuation of U.S. Pat. No. 5,387,067, and assigned to the assignee of the present invention, where both of the patents are incorporated herein by reference. In those patents, access at an acute angle is disclosed. However, the substrate slots retain the typical and more difficult configuration of substrate slots with the associated machining. Among other aspects, those references do not provide the desired modularity nor separate components for different substrate cassette configurations.

Thus, a need exists for simplifying the construction of a substrate cassette, modularizing the assembly of multi-slot cassettes, and providing multi-directional access into and from the cassette for the transfer of substrates.

SUMMARY OF THE INVENTION

The present invention generally provides a modular substrate cassette used to store substrates. The modular substrate cassette is designed to use different components that may be collectively assembled into different cassette configurations while substantially reducing or eliminating custom and complex fabrication costs. The modular substrate cassette also is configured to allow multi-directional access into and from two opposing faces of the cassette. The cassette may accommodate multiple substrate sizes, including 100 mm, 200 mm, and 300 mm substrates, as well as a variety of substrate shapes, including circular, square, and rectangular.

In one aspect of the invention, the modular cassette is assembled at least partially from standard geometries of bar stock and/or plate stock to minimize the costs of production. The invention provides a modular substrate cassette for holding a substrate, including a top bracket and a bottom bracket, a plurality of columnar supports connected to the top bracket and the bottom bracket and spaced from each other to support the substrate between the columnar supports, each columnar support comprising a plurality of components, where the components comprise a vertical support member and a lateral alignment member connected to the vertical support member. A spacer connected to the vertical support member or lateral alignment member may also be included to provide spacing between vertical support members.

In another aspect, the invention provides a modular substrate cassette, including a top bracket and a bottom bracket and at least two columnar supports connected to the top bracket and the bottom bracket, each columnar support comprising a connecting rod and a plurality of stackable components, where the stackable components comprise a vertical support member connected to the connecting rod and a lateral alignment member connected to the connecting rod and adjacent the vertical support member. The columnar supports can be arranged to allow multi-directional access to the substrate.

The invention also provides a method of using a modular substrate cassette in a substrate processing system, including loading a substrate into a modular substrate cassette having at least two vertical support members and at least two lateral alignment members, engaging the substrate with at least the two vertical support members, and unloading the substrate from the modular substrate cassette at an angular direction with respect to a normal line perpendicular to a face of the modular substrate cassette, independent of rotating the modular substrate cassette, where the vertical support members and the lateral alignment members are components adapted to be stacked in at least one column.

BRIEF DESCRIPTION OF THE DRAWINGS

So that the above recited features, advantages and objects of the present invention can be understood in detail, a more particular description of the invention, briefly summarized above, may be had by reference to the embodiments thereof which are illustrated in the appended drawings.

The appended drawings illustrate typical embodiments of this invention and are not to be considered limiting of its scope, for the invention may admit to other equally effective embodiments.

FIG. 3a is a schematic of an alternative embodiment of the modular substrate cassette.

FIG. 3b is a detail schematic of the embodiment of FIG. 3a.

DETAILED DESCRIPTION OF THE INVENTION

Figure 3:
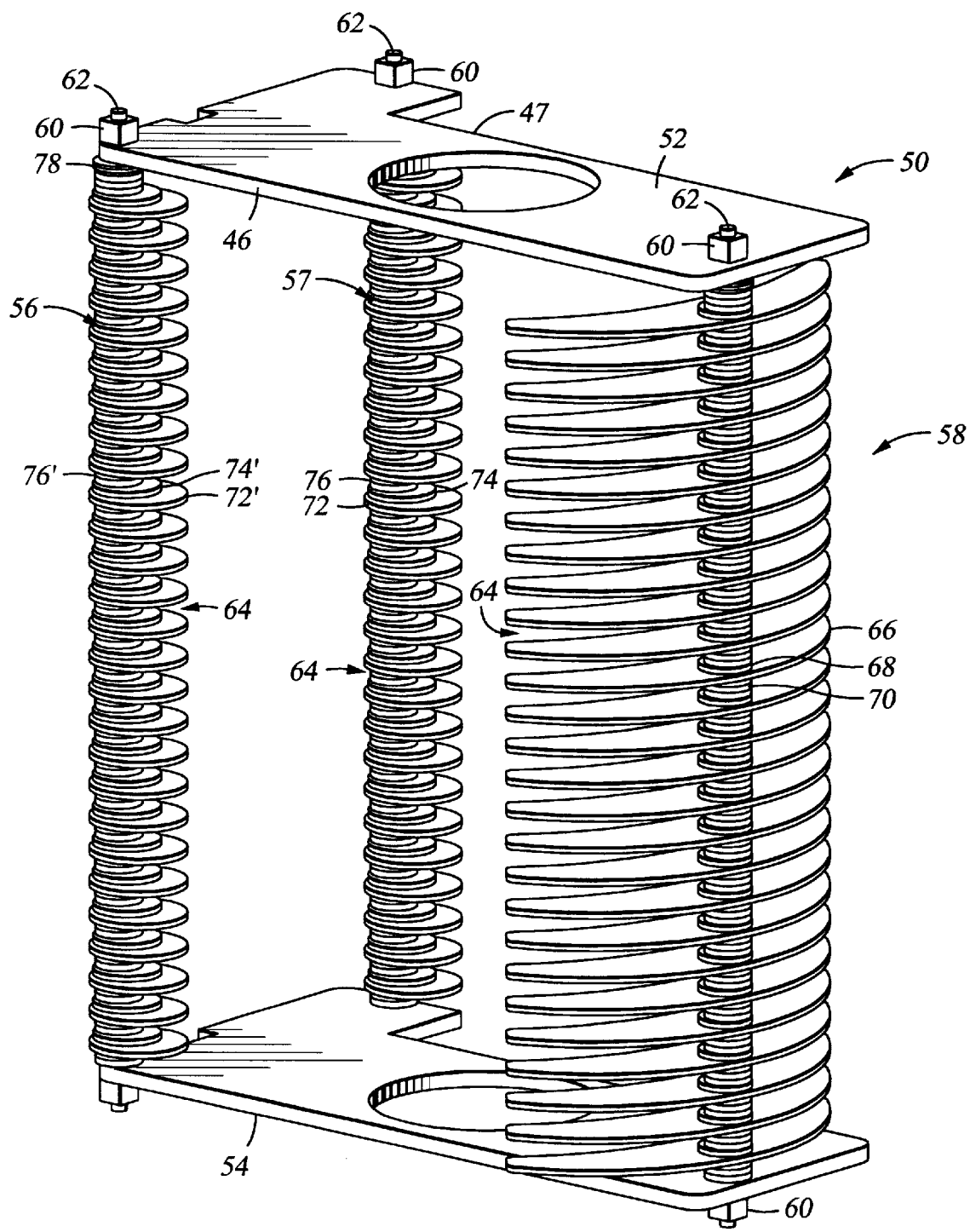
FIG. 3 is a schematic of the modular substrate cassette in a perspective view.

FIG. 3 shows a preferred embodiment of a modular substrate cassette of the invention in a perspective view. The substrate cassette 50 includes a top bracket 52 and a bottom bracket 54 with columnar supports 56, 57 and 58 disposed between the top and bottom brackets at a spacing that allows one or more substrates to be supported therebetween. The top and bottom brackets are held in a spaced relationship from each other using a connecting rod 62, disposed through each of the supports 56, 57, and 58. A pair of fasteners 60, such as nuts, secures the top and bottom brackets to the connecting rods 62. A plurality of substrate slots 64 are defined by a plurality of components including annular disks or plates of various sizes, which provide vertical support and lateral alignment of substrates and spacing between substrate slots. By arranging the sequence and quantity of the annular disks or plates, each cassette can be manufactured with a desired number of substrate slots and spacing between substrate slots using a common stock of materials. Also, different sizes of substrates may be accommodated using the same or similar columnar supports by geometrically adjusting the location of the connecting rod attachments in the appropriately sized top and bottom brackets. Three columnar supports provided in a preferred embodiment results in a support device approximating minimum degrees of freedom required to support the substrate, i.e., three support points to define a plane upon which the substrate may be supported, and reduces the complexity of aligning additional supports in the same plane as the three supports. Likewise, at least three lateral points are required for lateral stability in the preferred embodiment.

Some substrate cassettes, such as the ones shown in FIG. 3, are designed to be loaded and unloaded into and from each face 46 and 47 of the cassette 50. Other substrate cassettes are designed to be loaded and unloaded into and from only one face. Some substrate cassettes align the substrates in a horizontal plane, as shown in FIG. 3. Other substrate cassettes, such as the cassette shown in FIGS. 3a and 3b, align the substrate in an upright arrangement. The upright substrate cassette 50a has columnar supports 56a, 57a, and 58a with components disposed between the end brackets 52a and 54a, similar to the components in FIG. 3. The positioning of the columnar supports allows substrate access into and from the modular cassette 50a in a vertical direction between the columnar supports 57a and 58a. The columnar supports include some combination of the components to support the substrate and to separate the substrate from adjacent substrates. In this embodiment, the vertical support members 65 are smaller in cross section than the lateral alignment members 67. Spacers 69 may also be positioned at various points along the columnar supports. A variety of substrate cassettes may benefit from the modular aspect of the present invention and other aspects disclosed herein and are included within the scope of the claims.

Figure 4:
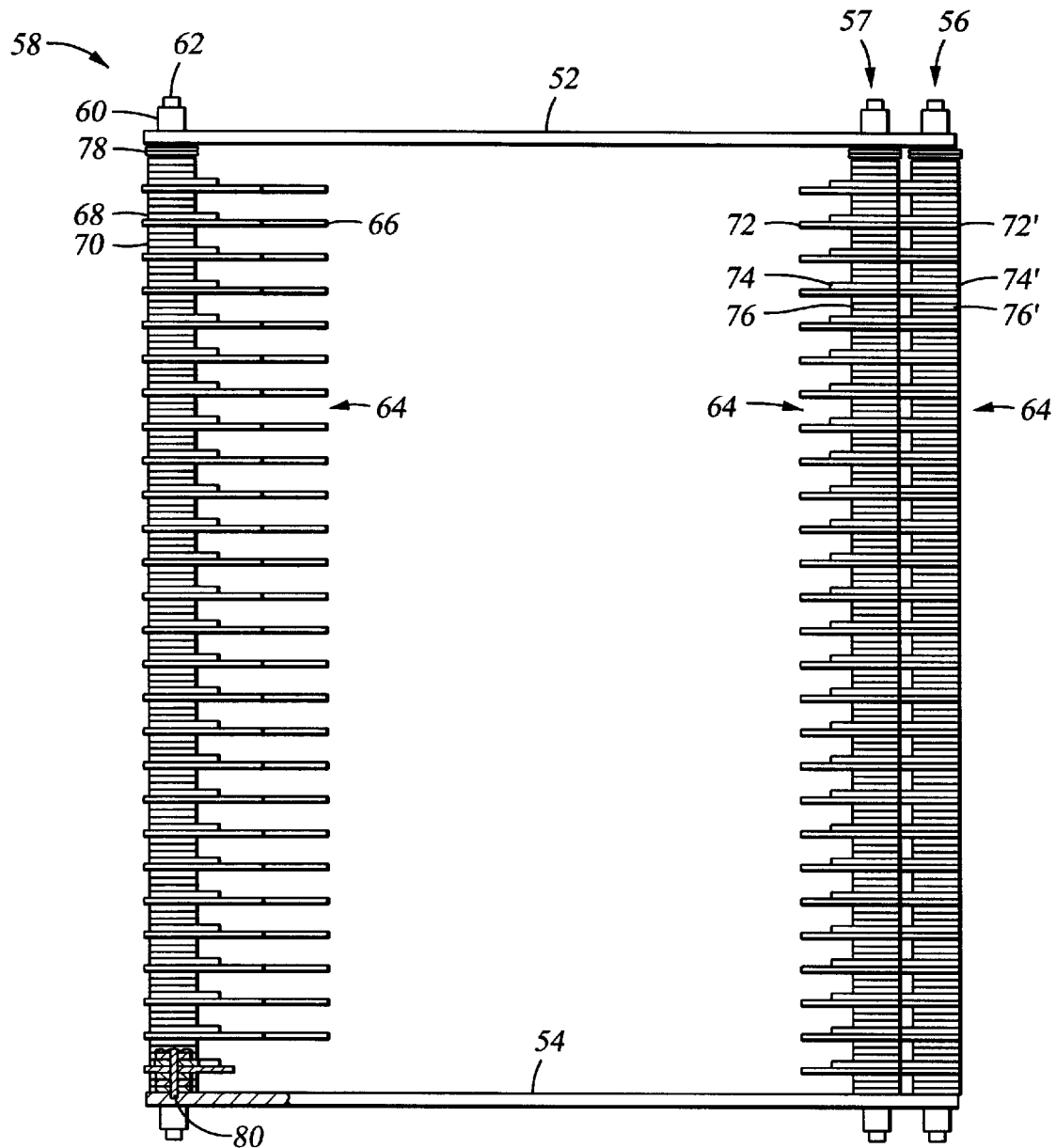
FIG. 4 is a schematic showing a front view of the modular substrate cassette.

FIG. 4 is a schematic front view of a modular substrate cassette 50, having 27 substrate slots 64. The columnar supports 56, 57, and 58 include corresponding vertical support members 66, 72', 72, lateral alignment members 68, 74', and 74, and optionally a quantity of spacers 70, 76', and 76 to define a substrate slot 64. Various arrangements of spacing in the substrate slots and number of substrate slots can be readily obtained by choosing an appropriate number of vertical support members, lateral alignment members, and, optionally, spacers.

Figure 2:
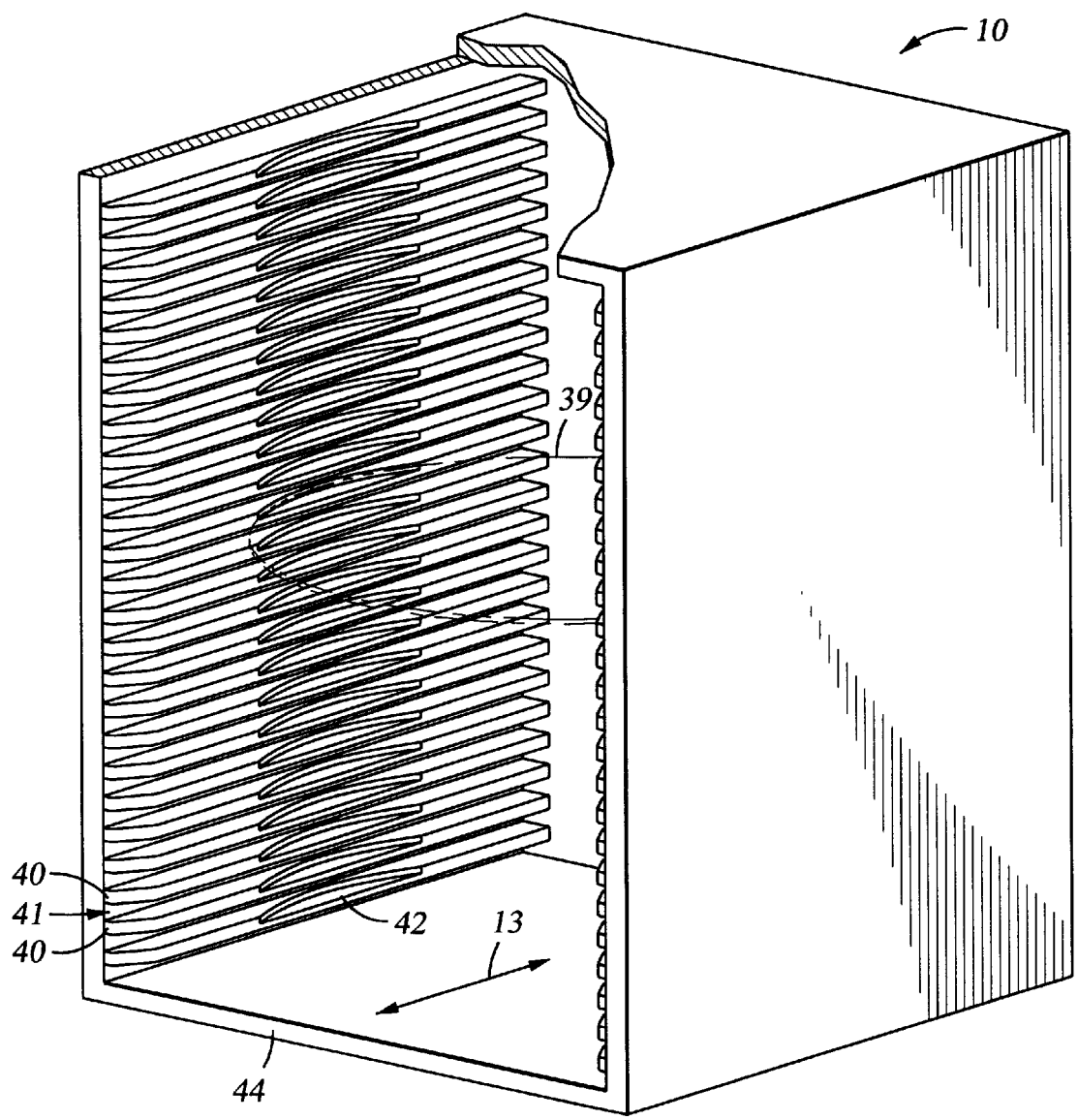
FIG. 2 is a perspective schematic of a typical substrate cassette.

The vertical support members 66, 72, and 72' are preferably flat plates or disks which do not require complex machining or grinding, unlike the substrate supports 40 and the alignment apertures 42 shown in FIG. 2. The vertical support members could include an elongated plate made of bar stock and may include a shoulder or recess into which the substrate sits, such as the vertical support member 66 shown in FIGS. 3 and 4. The lateral alignment members 68, 74, and 74' are preferably flat plates or disks, which do not require special machining or grinding. In the embodiment shown, the lateral alignment members 68, 74' and 74 are dimensionally the same, although the components could be sized and/or shaped differently. In the preferred embodiment, the vertical support members and lateral alignment members are separate components. Similarly, the spacers 70, 76, and 76' may be flat plates or disks, which are formed as separate components and can be stacked with the vertical support members and lateral alignment members to define the height of the substrate slots as desired. Likewise, in the embodiment shown, the spacers 70, 76', and 76 are dimensionally the same. The separate components are connected together to form the columnar supports 56, 57, and 58. The term "connected" includes associated, related, attached, positioned nearby in a fixed relative location, or supported or held in place. The size of the vertical support members is dependent at least on the spacing between the columnar supports and the clearance required for the robot blade to access the substrate between the vertical support members. Generally, in a preferred embodiment, the columnar supports support the substrate so that a substrate center of gravity is positioned between the columnar supports.

The components can be removed from the connecting rod or otherwise from each other and rearranged into other modular substrate cassette configurations. The spacers, or lateral supports in applications where spacers are not used, may be sized and/or configured to accommodate a variety of conventional or non-conventional substrate slot spacings between each vertical support member. Also, the length of the connecting rods may be varied to accommodate additional substrate slots or increased spacing between slots without having to modify the vertical support members, lateral alignment members, and spacers.

A compression element 78, such as a spring or a Belleville washer, may be used to compensate for relative rates of thermal expansion experienced between the components under processing conditions. In the embodiment shown in FIG. 4, each connecting rod includes at least one compression element 78. Thus, the compression element allows different coefficients of expansion experienced under processing conditions to be accommodated, for instance, between stainless steel connecting rods and ceramic substrate slots.

Figure 4A:
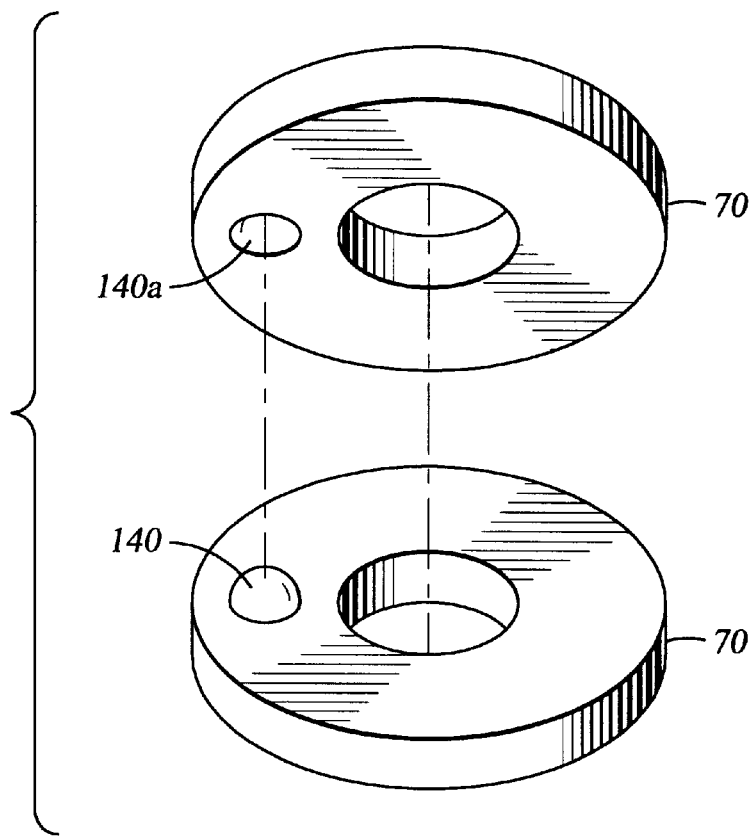
FIG. 4a is a schematic view of an alternative embodiment of an alignment protrusion on a component.
Figure 5:
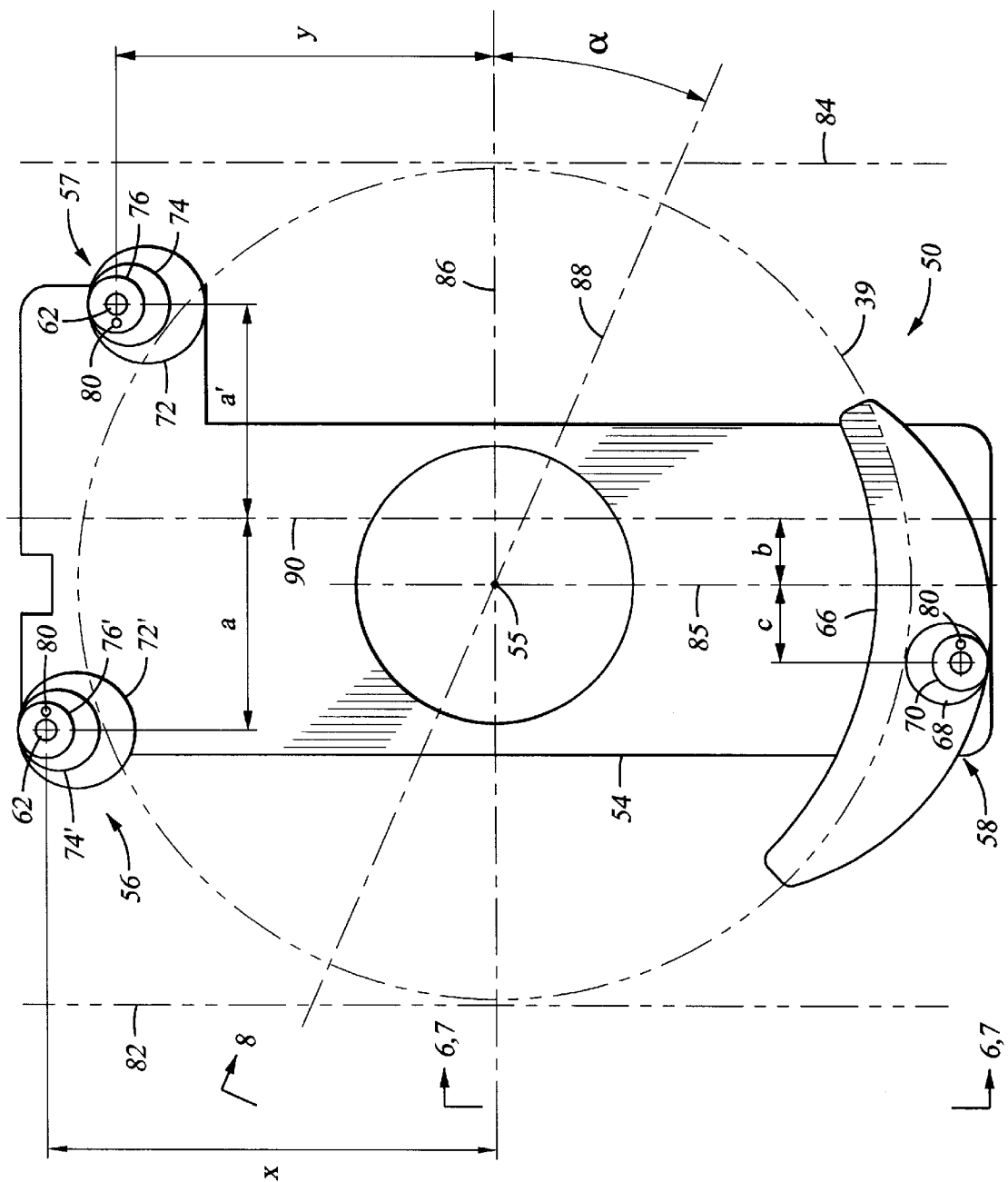
FIG. 5 is top view of the modular substrate cassette with the top bracket removed for clarity.

An orientation rod 80 is used in a preferred embodiment to maintain the relative orientation of the vertical support members, lateral alignment members, and spacers. The connecting rods in a preferred embodiment are circular and the openings in the vertical support members, lateral alignment members, and spacers are circular holes for ease of manufacturing. To further reduce the material costs, and yet provide a sufficient amount of support for the substrate, a smaller diameter or dimensioned stock material can be used for the vertical support members and a majority of the support area of the vertical support members can be positioned in the substrate transfer plane. Thus, the vertical support members may be positioned on the connecting rod at a point offset from the center of the vertical support members as shown in FIG. 5. The orientation rod 80 could be used to hold the vertical support members in the appropriate relative position toward the substrate. The orientation rod could be anchored to one or both of the brackets 52 and 54. The lateral alignment member and/or spacers could also be held by the orientation rod in like manner to maintain the relative orientation of the components and to prevent rotation of the components. The elongated vertical support members 66 of the columnar support 58 may also benefit from the use of an orientation rod 80. Alternatively, a non-circular opening, such as a keyway, in the vertical support members, lateral alignment members, and spacers may be used to engage a non-circular connecting rod and provide proper orientation of members without the need for an orientation rod. Also, features, such as alignment tabs or alignment protrusions 140, as shown in FIG. 4a, could be incorporated into the components, such as spacers 70, with a corresponding detent 140a, such as a hole or indentation, on an opposed component so that the components are self-aligning with respect to each other.

Figure 4B:
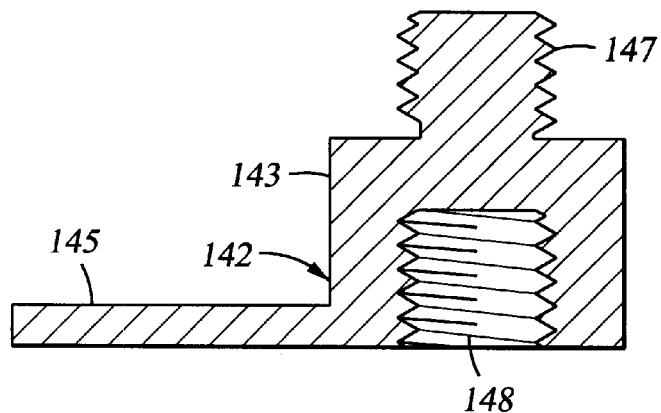
FIG. 4b is a schematic view of an alternative embodiment of the components as a subassembly.
Figure 4C:
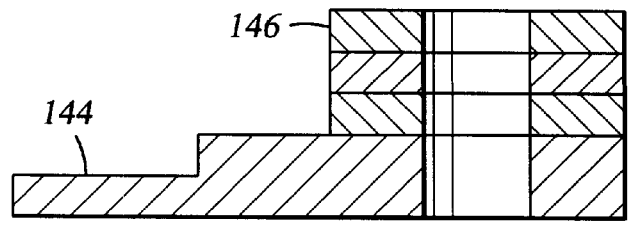
FIG. 4c is a schematic view of another alternative embodiment of the components as a subassembly.

Another embodiment of the invention includes combining the components into a subassembly. Thus, in one aspect, a "plurality of components" would include a plurality of subassemblies of the separate components. A subassembly 142, as shown in FIG. 4b, includes a lateral and vertical spacer portion 143 and a vertical support portion 145. In this embodiment, integral fasteners 147 and 148 could be provided so that the subassemblies could be attached to each other to create a columnar support and eliminate the connecting rods. For example, the integral fasteners could include threads, as shown in FIG. 4b, quick-turn fasteners, such as quarter-turn panel fasteners, a press-fit configuration, a protrusion with a corresponding detent or hole that are secured together such as with pins, snap-lock flanges, and other assembly variations. An alternative of another subassembly 144, as shown in FIG. 4c, could include a vertical support member having a lateral alignment shoulder formed thereon and one or more separate spacers 146. Other embodiments could combine the vertical support member, a lateral alignment member, and spacer(s) to provide a modular unit that could be combined with other such modular units. Furthermore, multiple substrate slots could be manufactured, such as by molding or machining. Other variations are possible and would depend on versatility, costs, durability, ease of repair, and yield, among other factors.

To assemble the substrate cassette of a preferred embodiment, a quantity of vertical support members, lateral alignment members, and spacers are placed on a connecting rod in a predetermined manner to build each columnar support. As described above, a standard substrate cassette includes 25 substrate slots. If a customer desires a different number of substrate slots from the standard quantity, such as 27 substrate slots, the assembly person merely needs to insert two more vertical support members and lateral alignment members, and an optional quantity of spacers, onto the columnar support.

The vertical support members, lateral alignment members, and spacers may be made from metal such as aluminum or stainless steel, plastics such as PEEK® and Vespel®, or ceramics such as aluminum oxide, silicon carbide, silicon nitride, and other materials depending on the temperatures of the substrates, processing conditions, outgassing properties under vacuum, particulate generation, and expense of raw materials and manufacturing. The connecting rods may be made from metals, such as stainless steel, nickel, nickel-coated materials, ceramics, or other vacuum conducive materials.

Importantly, the interchangeability of the components allows the manufacturer to customize cassettes for customers using stock items. Also, the use of common stock material to define the substrate slots significantly reduces the cost of the cassette and eliminates expensive machining requirements. The design of the components allows a standard shape of bar stock and/or plate stock, such as a round bar, to be cut into disks, ground or machined flat for dimensional accuracy, and hole(s) drilled through the disks.

FIG. 5 is a top view of a modular substrate cassette 50 with the top bracket removed for clarity. The columnar supports 56, 57, and 58 are spaced on the brackets relative to one another to allow multi-directional access and to support the substrate center of gravity within an area between the columnar supports. For example, in FIG. 5, a front plane 82 on one face of the substrate cassette and a rear plane 84 on the opposite face of the modular substrate cassette are shown. The front plane is disposed perpendicular to the direction of travel of a first robot, similar to the substrate loading direction of arrow 13 in FIGS. 1 and 2. A normal line 86, substantially perpendicular to the front plane 82, passes through a center of gravity 55 of the substrate. A coordinate axis 85, is defined as a line passing through the center of gravity 55 and perpendicular to the normal line 86. The columnar support 56 is separated by a distance x from the normal line 86 and the columnar support 57 is separated by a distance y from the normal line 86, where x is greater than y. A line 90, parallel to the coordinate axis 85, is situated at about equal perpendicular distances a and a' from the columnar supports 56 and 57. The line 90, disposed between the columnar supports 56 and 57, is spaced a distance b from the coordinate axis 85, where b may be a distance from zero to infinity. The columnar support 58 is separated from the coordinate axis 85 by a distance c, where c may also be a distance from zero to infinity. Generally, the greater the distance b on one side of the coordinate axis 85, then the greater the distance c on the other side of the coordinate axis 85 to provide substrate support in conjunction with the center of gravity 55. The distances a, a', b, c, x, and y would depend on particular substrate size and shape and the desired angle $\alpha$. The supports, positioned by the combination of geometries and distances, yield an orientation that may be used to load and unload a substrate 39 at the rear plane 84 from other than the normal line 86 by an angle $\alpha$ at an angular direction 88. For instance, and without limitation, the angle $\alpha$ may be between about 0° and 35°, preferably about 10° to about 35°. The normal loading at the front plane is accomplished by the clearance provided by the spacer dimension compared to the lateral alignment member. The ability to load and unload in a normal direction on one face of the substrate cassette and still be able to unload and load in an angular direction on another face of the cassette is seen by describing an operation sequence, in reference to FIGS. 6-8 below.

FIG. 5 also shows the shape of the vertical support member 66 of a preferred embodiment, having an elongated and curved shape oriented toward the substrate to add additional support to the substrate. The vertical support member 66 could be made of plate or bar stock, and cut into slices, ground flat for dimensional accuracy, without the machining or grinding complications of the prior substrate supports 40 and alignment apertures 42 described in reference to FIG. 2.

Figure 1:
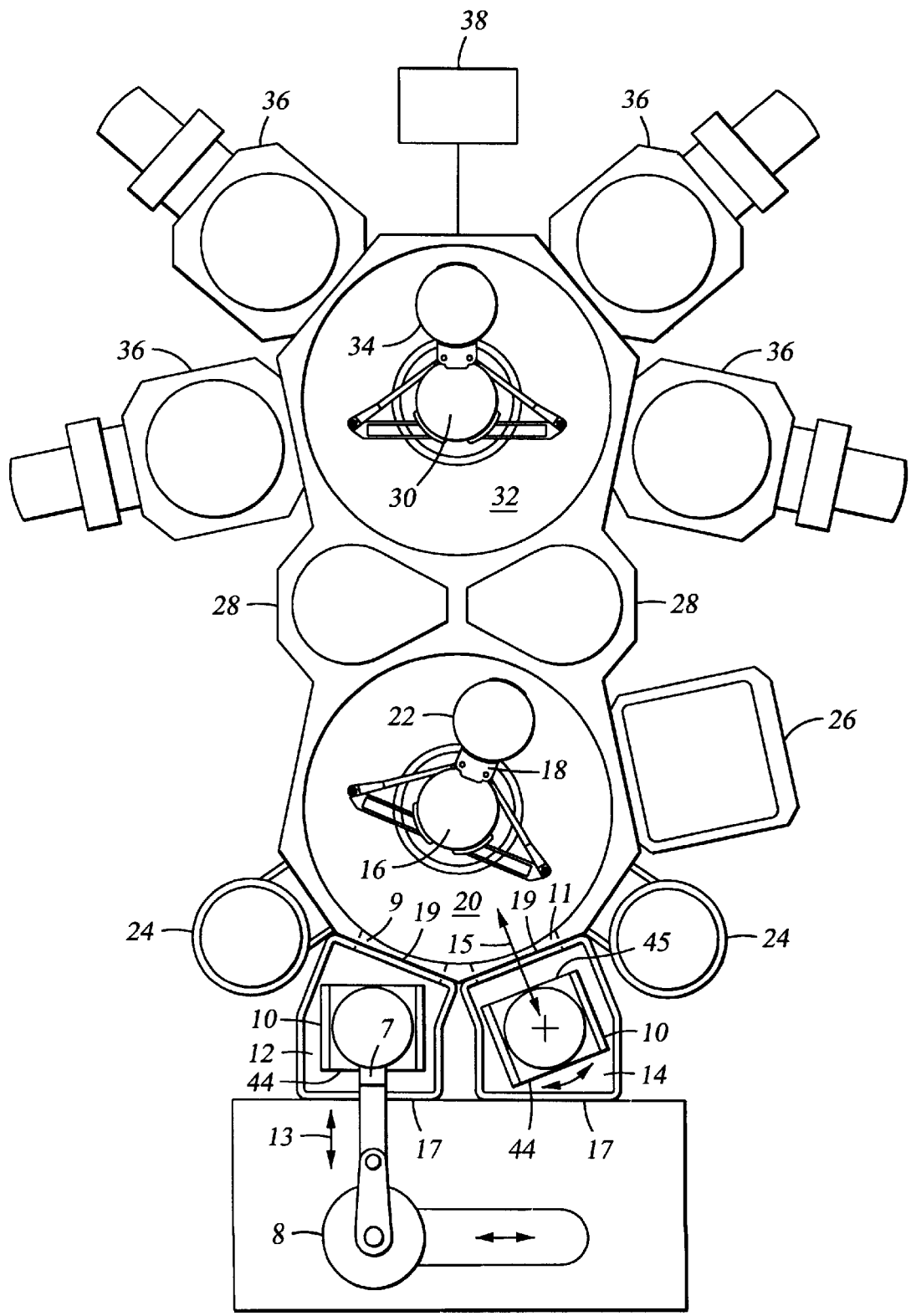
FIG. 1 is a top schematic view of a commercially available radial cluster tool for batch processing of substrates.
Figure 6:
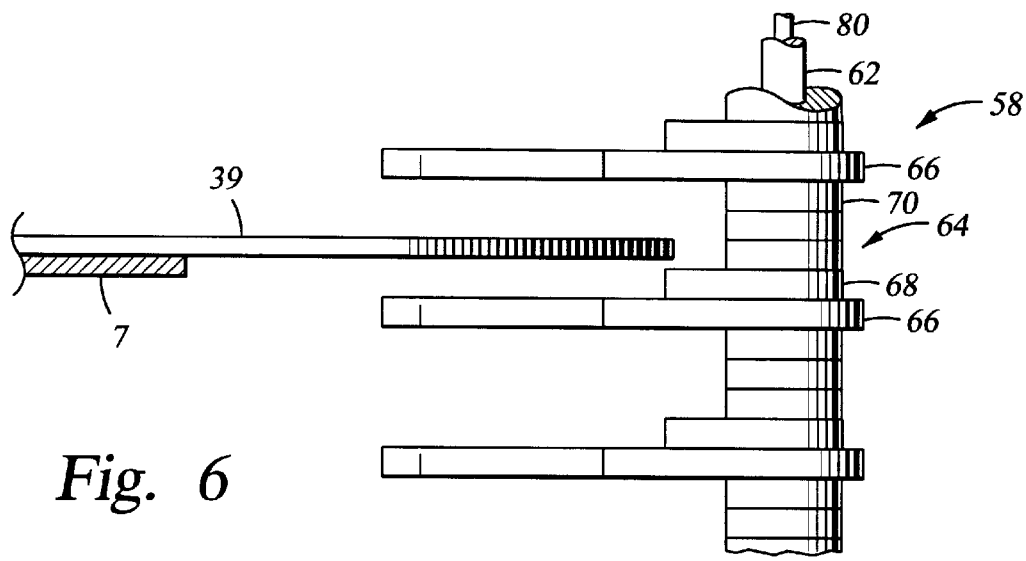
FIG. 6 is a side view schematic of a substrate disposed above the vertical support member and aligned with a lateral alignment member and adjacent at least one spacer.
Figure 7:
FIG. 7 is a side view schematic of a substrate supported by the vertical support member and aligned with a lateral alignment member.
Figure 8:
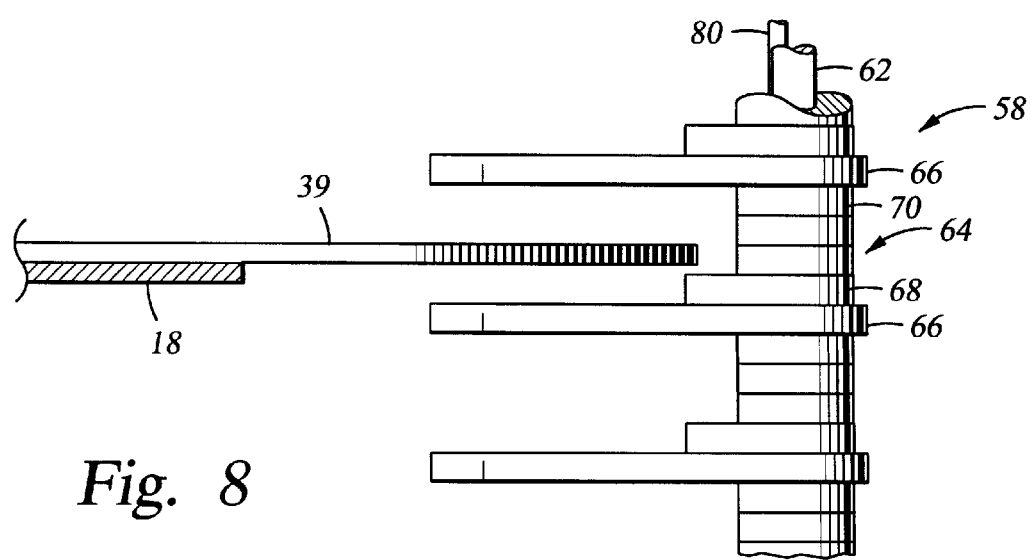
FIG. 8 is a side view schematic of a substrate disposed above the vertical support member and adjacent a set of spacers at an angular direction from the view of FIG. 6.

An operation sequence is shown in FIGS. 6-8, where FIGS. 6 and 7 depict the substrate position in the direction of the normal line 86 and FIG. 8 depicts the substrate position in the direction of the angular direction 88. In operation, a loading robot blade 7 supports a substrate 39 and inserts the substrate into the modular substrate cassette 50 between the spacers 70 of columnar support 58, shown in FIG. 6, and the corollary spacers 76' and 76 of columnar supports 56 and 57, shown in FIG. 5. Once in position above the vertical support member 66 and between the lateral alignment member 68 and the corollary components of columnar supports 56 and 57, a substrate cassette shaft (not shown) lifts the substrate cassette so that the substrate engages the vertical support members and lifts the substrate from the loading robot blade 7 as shown in FIG. 7. Thus, the substrate is supported by the vertical support members between the lateral alignment members. The loading robot then retracts, retrieves another substrate, and repeats the sequence until the substrate cassette is loaded with an appropriate number of substrates. The load lock chamber, shown in FIG. 1, is closed and a vacuum is obtained. A slit valve opens to allow a first transfer robot to retrieve a substrate from within the transfer chamber, opposite the previously described loading direction. In a preferred embodiment, the first robot can load and unload the substrate without the cassette needing to rotate. Referring to FIG. 8, as the first transfer robot blade 18 is positioned under the substrate 39, the substrate cassette is lowered allowing the first robot blade to engage the substrate and lift the substrate from the vertical support member 66 above the lateral alignment member 68 and between the spacers 70. With the spacer dimension correlated with the lateral alignment member dimension, the substrate passes the spacer 70 with sufficient clearance to be removed from the cassette, even at the angle α, shown in FIG. 5. The chamber robot passes the substrate to the various chambers where the substrate is processed and returned to the cassette.

Figure 9:
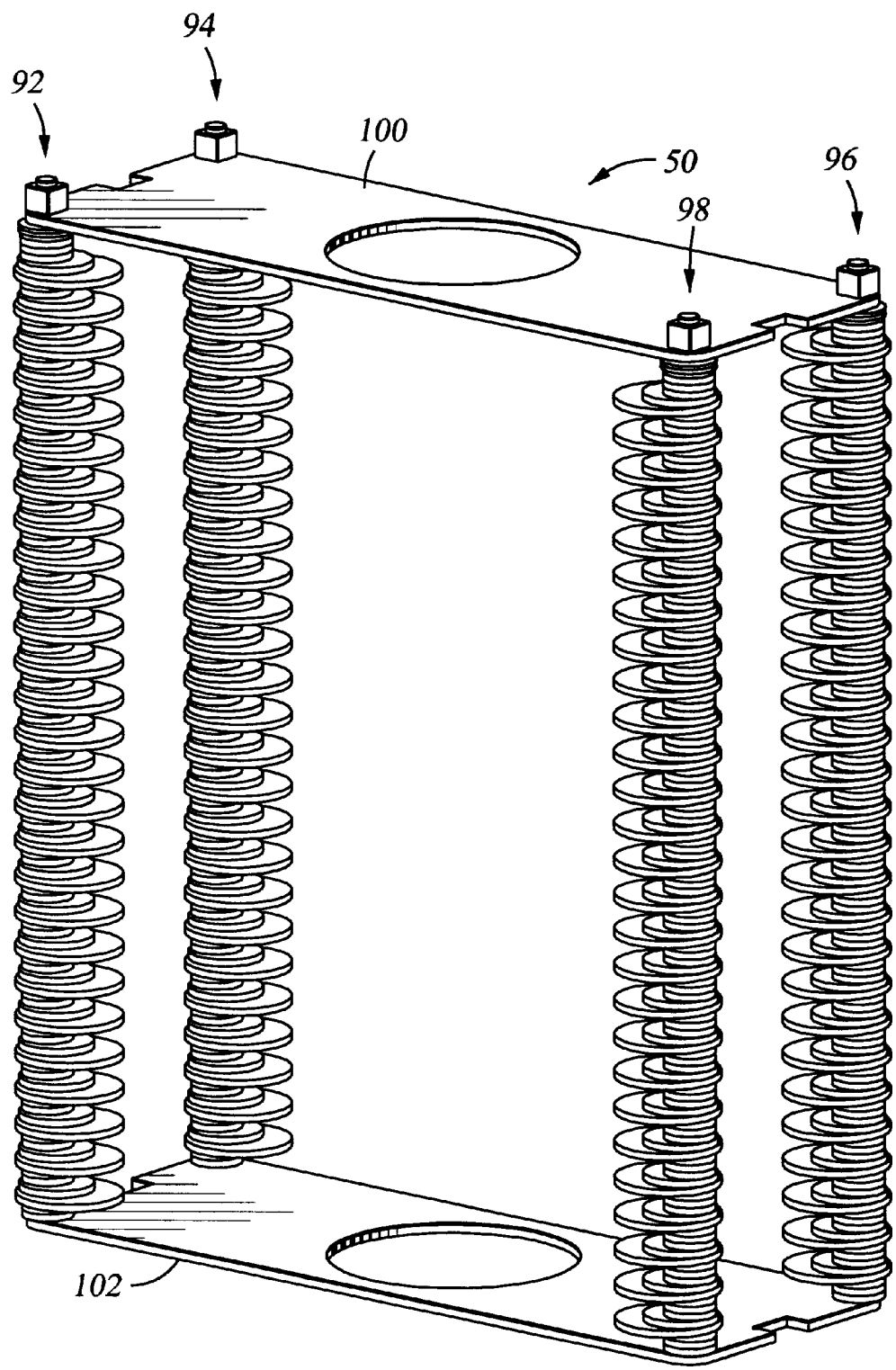
FIG. 9 is a schematic of another embodiment of the present invention in perspective view.

FIG. 9 is a perspective view of another embodiment of the present invention. Four columnar supports, 92, 94, 96, and 98, similar to columnar supports 56 and 57, are disposed between the top bracket 100 and the bottom bracket 102. A substrate slot 104 is defined by the vertical support members, lateral alignment members, and spacers. The embodiment of FIG. 9 provides simplicity and uniformity of the vertical support components and symmetrical spacing of the columnar supports for ease of manufacturing and assembly.

Figure 10:
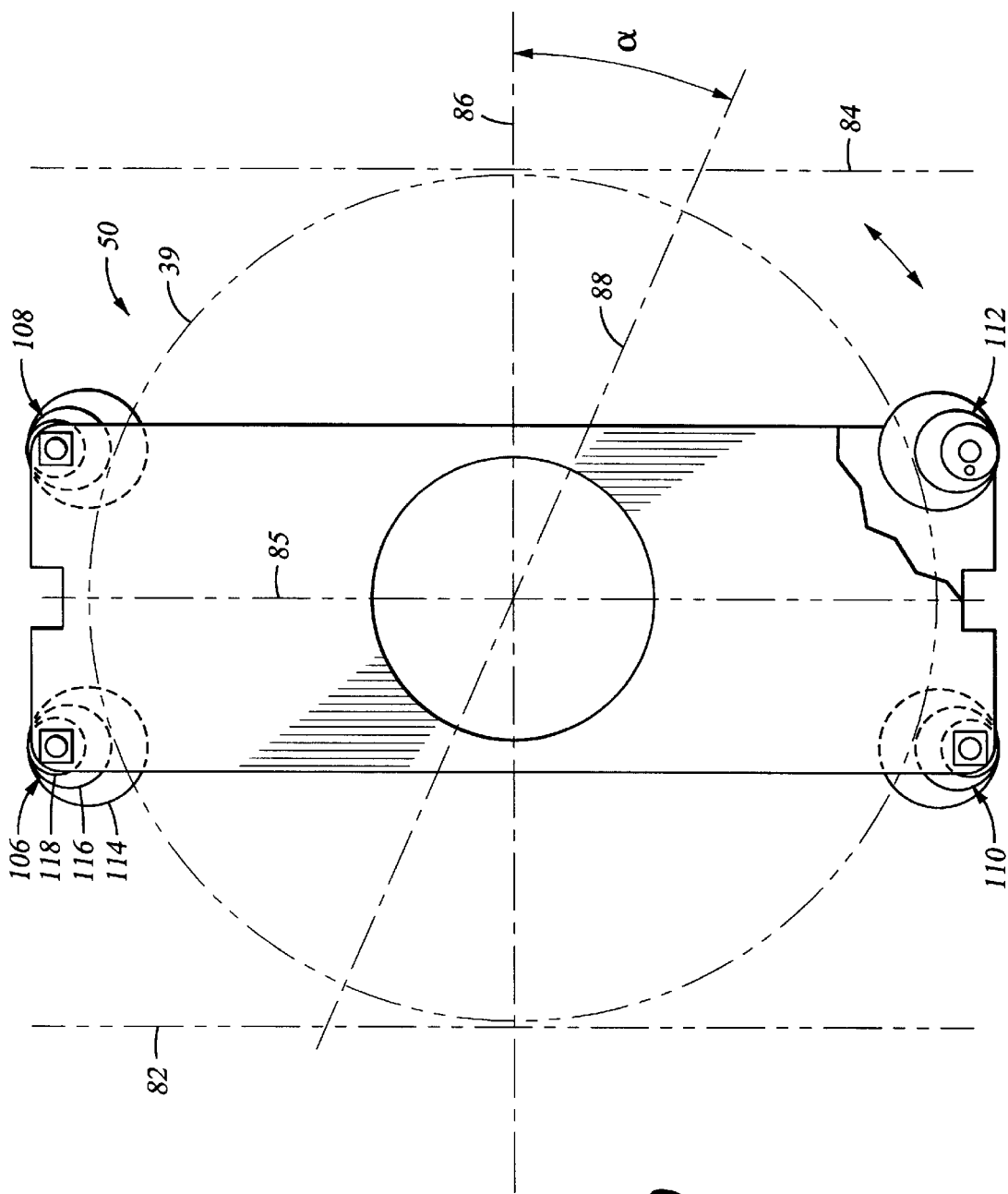
FIG. 10 is a schematic of the embodiment of FIG. 9, shown as a top view.

FIG. 10 is a top schematic view of the embodiment of FIG. 9. Four columnar supports 106, 108, 110, and 112 and corresponding connecting rods are arranged symmetrically about the substrate cassette 50. The direction for loading and unloading on the front plane 82 is in the direction of normal line 86, such as shown and described in reference to FIG. 5. A vertical support member 114, a lateral alignment member 116, and various quantities of spacers 118 are arranged to create a substrate slot similar to the embodiments heretofore described. An alternate embodiment of the vertical support member could include an elongated plate and could connect a pair of connecting rods. The plate could be made of bar stock and could be positioned with the center offset with respect to the normal line 86 to provide additional area for support, as discussed above.

Figure 11:
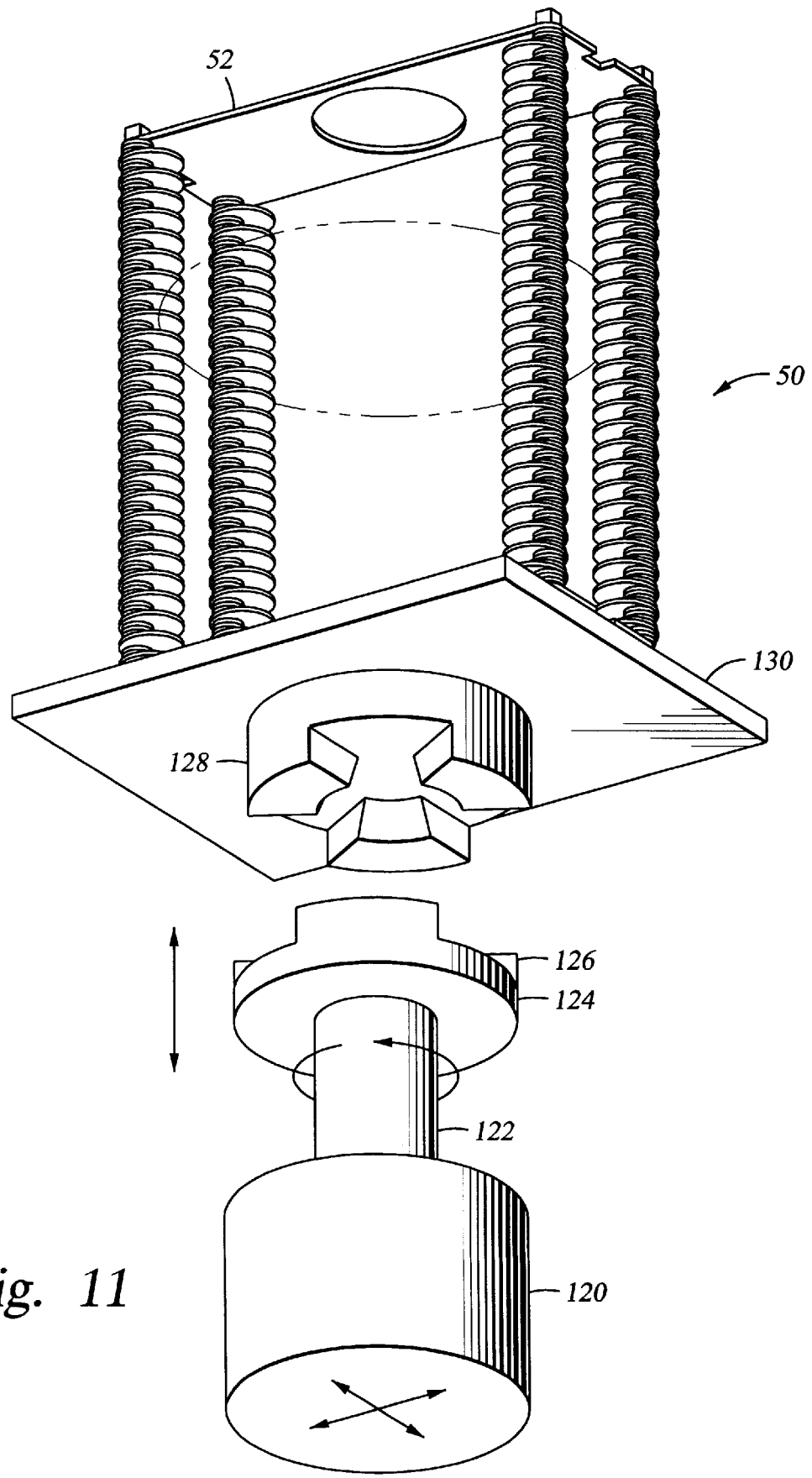
FIG. 11 is a schematic of one embodiment of a rotating indexer and the modular substrate cassette.

The substrate 39 may be loaded/unloaded in the direction of the normal line 86. Alternatively, the substrate may be loaded/unloaded in the angular direction 88 by rotating the modular substrate cassette 50 with a positioning device. A positioning device 120 is shown in the schematic view of FIG. 11. The positioning device can be a device(s) to position the cassette linearly along an axis or multiple axes, it can be a device to position the cassette angularly, such as a rotating indexer, or it can be a device operable in multiple directions. The microprocessor controller may control the positioning device 120 in conjunction with other aspects of the load lock chambers, processing chambers, substrate cassette movements, and other functions incident to substrate processing. The positioning device 120 can include a shaft 122 that raises and lowers the substrate cassette 50 for the loading and unloading of each substrate in the substrate cassette. Typically, a substrate cassette can be attached to a loading/leveling platform 130 that is used to align the substrate cassette with the robots, slit valves and associated equipment. In this embodiment, the shaft can be attached to a coupling 124 which includes at least one engagement member 126. The embodiment shows three engagement members, which mate to a set of mating engagement members 128 on the loading/leveling platform 130 connected to the substrate cassette 50 so that when the shaft and coupling raise in position and the engagement members engage, the shaft can rotate the substrate cassette to some angular predetermined position. By rotating the substrate cassette 50, the substrate 39 can be loaded and unloaded in some angular direction 88 from the normal line 86. The positioning device may also move the cassette linearly in the direction of the axes shown, in an arc as appropriate, or some combination of linear and angular movement.

While the foregoing is directed to preferred embodiments of the present invention, other and further embodiments of the invention may be devised without departing from the basic scope thereof, and the scope thereof is determined by the claims that follow.

What is claimed is:

1. A modular substrate cassette for holding a substrate, comprising:
   a) a top bracket and a bottom bracket;
   b) a plurality of columnar supports connected to the top bracket and the bottom bracket and spaced from each other to support the substrate between the columnar supports, each columnar support comprising a plurality of components, the components comprising:
      1) a vertical support member; and
      2) a lateral alignment member connected to the vertical support member.

2. The modular substrate cassette of claim 1, wherein the components further comprise a spacer.

3. The modular substrate cassette of claim 1, wherein the substrate slot configurations range from at least about one substrate slot to about 100 substrate slots.

4. The modular substrate cassette of claim 2, wherein the vertical support member, the lateral alignment member, and the spacer comprise separate components.

5. The modular substrate cassette of claim 4, wherein the vertical support member, the lateral alignment member, and the spacer are planar separate components.

6. The modular substrate cassette of claim 2, wherein the vertical support member, the lateral alignment member, and the spacer comprise an opening in each component adapted to allow insertion of a connecting rod to create a stack of connected components.

7. The modular substrate cassette of claim 2, wherein the spacer and the lateral alignment member comprise a subassembly adapted to be assembled with the vertical support member in the substrate slot configurations.

8. The modular substrate cassette of claim 1, further comprising a connecting rod, wherein the vertical support member and the lateral alignment member are connected to the connecting rod at an offset distance from a center of the vertical support member and the lateral alignment member, respectively.

9. The modular substrate cassette of claim 1, wherein at least one vertical support member comprises a non-circular plate.

10. The modular substrate cassette of claim 1, further comprising an orientation rod engaged with at least one of the components.

11. The modular substrate cassette of claim 9, further comprising at least two columnar supports arranged on the top and bottom brackets to allow angular loading and unloading of the substrate with respect to a face of the modular substrate cassette.

12. The modular substrate cassette of claim 11, wherein a first columnar support is disposed closer to a normal line perpendicular to the face of the modular substrate cassette than a second columnar support and wherein the third columnar support is spaced a distance from a coordinate axis perpendicular to the normal line and passing through a substrate center of gravity to allow multi-directional access of the substrate.

13. The modular substrate cassette of claim 1, wherein the columnar supports allow multi-directional access of the substrate.

14. The modular substrate cassette of claim 13, further comprising a rotatable positioning device adapted to rotate the modular substrate cassette to allow the multi-directional access.

15. A method of using a modular substrate cassette in a substrate processing system, comprising:
   a) loading a substrate into a modular substrate cassette having at least two vertical support members and at least two lateral alignment members;
   b) engaging the substrate with at least the two vertical support members; and
   c) unloading the substrate from the modular substrate cassette at an angular direction with respect to a normal line perpendicular to a face of the modular substrate cassette, independent of rotating the modular substrate cassette,
   the vertical support members and the lateral alignment members being components adapted to be stacked in at least one column.

16. The method of using a modular substrate cassette of claim 15, further comprising accessing the substrate parallel to a normal line perpendicular to one face of the modular substrate cassette and accessing the substrate at the angular direction with respect to the normal line on another face of the modular substrate cassette.

17. The method of using a modular substrate cassette of claim 15, further comprising holding the vertical support members and the lateral alignment members in relative orientation to one another when stacked in the column.

18. A modular substrate cassette, comprising:
   a) a top bracket and a bottom bracket; and
   b) at least two columnar supports connected to the top bracket and the bottom bracket, each columnar support comprising:
      1) a connecting rod; and
      2) a plurality of stackable components, comprising:
         a) a vertical support member connected to the connecting rod; and
         b) a lateral alignment member connected to the connecting rod and adjacent the vertical support member.

19. The modular substrate cassette of claim 18, wherein at least one of the columnar supports comprises at least one spacer having a smaller cross section than the lateral alignment member and connected to the connecting rod.

20. The modular substrate cassette of claim 18, further comprising an orientation rod engaged with at least one of the components.

21. The modular substrate cassette of claim 18, wherein at least one of the columnar supports comprises an elongated vertical support member.

22. The modular substrate cassette of claim 18, wherein the columnar supports are arranged on the brackets to allow multi-direction access to the substrate.

23. The modular substrate cassette of claim 18, wherein the vertical support members, the lateral alignment members, and the spacers comprise separate components.

24. The modular substrate cassette of claim 19, wherein the spacers and the lateral alignment members comprise subassemblies adapted to be assembled with the vertical support members.

25. The modular substrate cassette of claim 19, wherein at least one lateral alignment member is connected to the connecting rod at an offset distance from a center of the lateral alignment member.

26. The modular substrate cassette of claim 18, further comprising compression members connected to the connecting rod.

27. The modular substrate cassette of claim 18, wherein the modular substrate cassette is adapted to be configured from about one substrate slot to about 100 substrate slots by arranging the sequence and quantity of vertical support members and lateral alignment members.

28. The modular substrate cassette of claim 18, further comprising a linear positioning device adapted to position the modular substrate cassette along at least one axis.

29. The modular substrate cassette of claim 28, further comprising a rotatable positioning device adapted to rotate the modular substrate cassette to allow loading and unloading of the substrate cassette.

30. The modular substrate cassette of claim 1, wherein the vertical support member and lateral alignment member comprise a subassembly adapted to be assembled into a stack of connected components.

31. The modular substrate cassette of claim 2, wherein the vertical support member, lateral alignment member, and spacer comprise a subassembly adapted to be assembled into a stack of components.

32. The modular substrate cassette of claim 1, wherein at least one component comprises an alignment protrusion.

* * * * *